United States Patent
Higuchi

(10) Patent No.: US 6,654,269 B2
(45) Date of Patent: Nov. 25, 2003

(54) ASSOCIATION MEMORY AND MEMORY CELL THEREOF

(75) Inventor: Tsuyoshi Higuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/103,722

(22) Filed: Mar. 25, 2002

(65) Prior Publication Data

US 2003/0095425 A1 May 22, 2003

(30) Foreign Application Priority Data

Nov. 16, 2001 (JP) ........................................ 2001-352203

(51) Int. Cl.[7] .............................................. G11C 15/00
(52) U.S. Cl. ...................................... 365/49; 365/189.07
(58) Field of Search ................................ 365/49, 189.07

(56) References Cited

U.S. PATENT DOCUMENTS 5,422,838 A * 6/1995 Lin .............................. 365/49
6,163,473 A    12/2000 Hannum

* cited by examiner

*Primary Examiner*—Huan Hoang
(74) *Attorney, Agent, or Firm*—Arent Fox Kintner Plotkin & Kahn, PLLC

(57) ABSTRACT

A memory cell of the association memory including a register, a transmission circuit, and a match circuit is provided. A register stores storage data when its own memory cell is not in the don't care state, and stores the don't care data in the adjacent memory cell when in the don't care state. A transmission circuit transmits the don't care data indicating that the other adjacent memory cell is in the don't care state to the other adjacent memory cell when both of the don't care data transmitted from the one adjacent memory cell and the don't care data stored its own memory cell indicate the don't care state. A match circuit outputs match data indicating the agreement when the storage data stored in the register and the search data supplied from the outside agree with each other.

15 Claims, 13 Drawing Sheets

F I G. 3
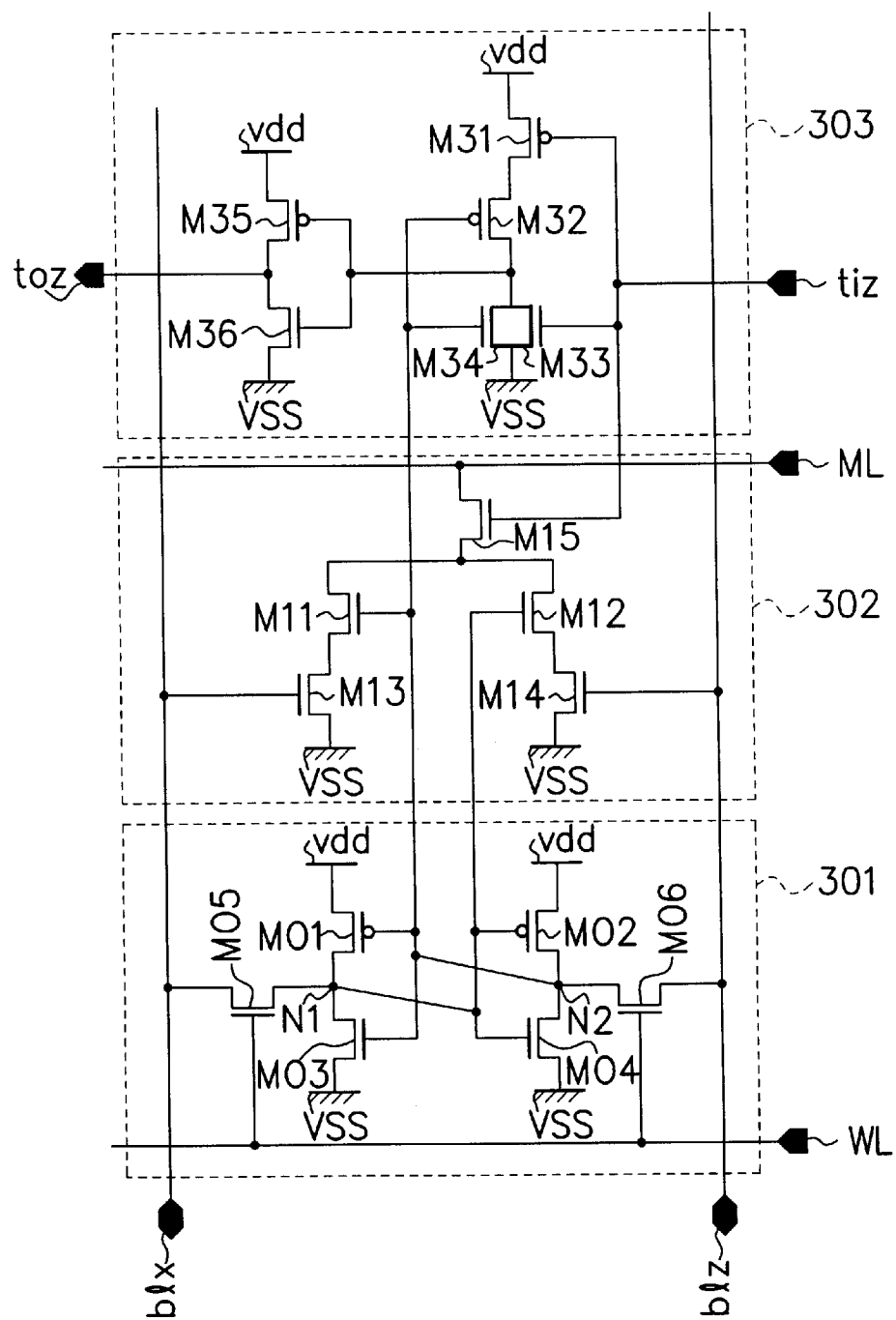

ASSOCIATION MEMORY AND MEMORY CELL THEREOF

CROSS-REFERENCE TO RELATED APPLICATIONS

This application is based upon and claims priority of Japanese Patent Application No. 2001-352203, filed on Nov. 16, 2001, the contents being incorporated herein by reference.

BACKGROUND OF THE INVENTION

1. Field of the Invention

The present invention relates to an association memory which is capable of setting a "don't care" state to each memory cell thereof and the memory cell used in the association memory.

2. Description of the Related Art

The association memory is a semiconductor device, wherein a search word is inputted and a corresponding storage term is searched to thereby issue its address. There are two known types of the association memory, one being a binary association memory and the other being a ternary association memory. The binary association memory does not have the don't care function to each storage word. The binary association memory searches for the storage word that completely matches the search word and then outputs its address. The ternary association memory is capable of designating partial bits of the storage word to the don't care state, so that the designated portion of the storage word is assumed to match irrespective of the search word.

FIG. 13 is a circuit diagram of a memory cell in a conventional binary association memory. The operation of the memory cell will be explained when running the search in the binary association memory. In nodes N1/N2, High level (hereafter referred to as "H")/Low level (hereafter referred to as "L") or L/H is stored. When searching, a word line is set as WL=L and a search data is given to bit lines blz/blx. In a state that the bit lines blz/blx=H/L and the nodes N1/N2=H/L, or the bit lines blz/blx=L/H and the nodes N1/N2=L/H are given ("Match" state), the current does not pass from a match line ML to a reference potential vss (Ground) so that the current potential of the match line ML does not change. In a state that the bit lines blz/blx=L/H and the nodes N1/N2=H/L, or the bit lines blz/blx=H/L and the nodes N1/N2=L/H are given ("Mismatch" state), the current passes from the match line ML to the reference potential vss (Ground) so that the current potential of the match line ML goes down. The memory cells are so connected to the match line ML as its number corresponds to that of the recorded word. When all the memory cells of the word match, the potential of the match line ML does not change. Even if only one memory cell does not match, the potential of the match line ML decreases. The agreement between the storage word and the search word is searched by judging the potential.

FIG. 14 is a circuit diagram of a memory cell in a conventional ternary association memory. Generally, the ternary association memory is capable of searching a required address with less command numbers, which makes the market needs strong. The operation of the memory cell will be explained when running the search in the ternary association memory. The memory cell comprises two registers to store three states of 0, 1, and don't care state, and the read/write transistors M01 to M06, and M61 and M64. A storage data for comparing is stored in one resistor M01 and M04, and a don't-care data to indicate whether it is in a don't care state or not is stored in the other resistor M61 and M64. When in the don't care state, the nodes are N3/N4=L/H, and when not in the don't care state, the nodes are N3/N4=H/L. When in the don't care state, a transistor M15 is set to be OFF so as to take a match state irrespective of the search data. When not in the don't care state, the transistor M15 is set to be ON, so as to take the same operation as that in the binary association memory. Accordingly, the memory cell has a disadvantage of becoming larger in size than that of the binary association memory due to the resistors M61 to M64, the read/write transistors M65 and M66 thereof and the transistor M15. Since 2 bits of data are required to be stored in a memory, it is necessary to prepare twice numbers of bit lines blz and blx for the read/write or to take twice times for the read/write, compared to the binary association memory. Further, the ternary association memory requires twice of the total memory capacity compared with the binary association memory, which results in a disadvantage of high possibility of failures to cause a low yield.

Therefore, the ternary association memory compared with the binary association memory having the same storage capacity has disadvantages of cost increase due to increase of the area for the memory cell or decrease of the yield, increase of read/write time or increase of the bus numbers.

SUMMARY OF THE INVENTION

The objects of the present invention is reduction of the memory size, improvement of the yield, reduction of the read/write time to the memory cell, and/or reduction of the number of bit lines, in a ternary association memory.

According to an aspect of the present invention, a memory cell of a ternary association memory comprising a register, a transmission circuit, and a match circuit is provided. The register stores the storage data when own memory cell is not in a don't care state, and stores a don't care data which indicates whether the adjacent memory cell is in a don't care state or not, when own memory cell is in a don't care state. When both of the don't care data transmitted from one of the adjacent memory cells and the don't care data stored in its own memory cell indicate a don't care state, the transmission circuit transmits the don't care data which indicates that the other of the adjacent memory cells is in the don't care state to the other of the adjacent memory cells. The match circuit outputs a match data indicating a matching state when a storage data stored in the register and a search data supplied from the outside are matched.

The register stores any of the storage data or the don't care data, which makes it unnecessary to provide 2 pieces of registers to store both the storage data and the don't care data. Since one piece of register is necessary to be provided in the memory cell, the total storage capacity of the memory required becomes small, which lowers the possibility of failures so that the yield is increased. In addition, the memory cell and the association memory including thereof can be miniaturized. Further, since the memory cell is required to be provided with only one piece of the registers, execution of the read/write to that one piece of the register can be achieved at a time. In other words, reduction of read/write time to the memory cell and reduction of the number of bit lines can be achieved.

BRIEF DESCRIPTION OF THE DRAWINGS

FIG. 3 is a circuit diagram showing a configuration example of a memory cell in a memory cell group;

DETAILED DESCRIPTION OF THE PREFERRED EMBODIMENTS

First Embodiment

Figure 1A:
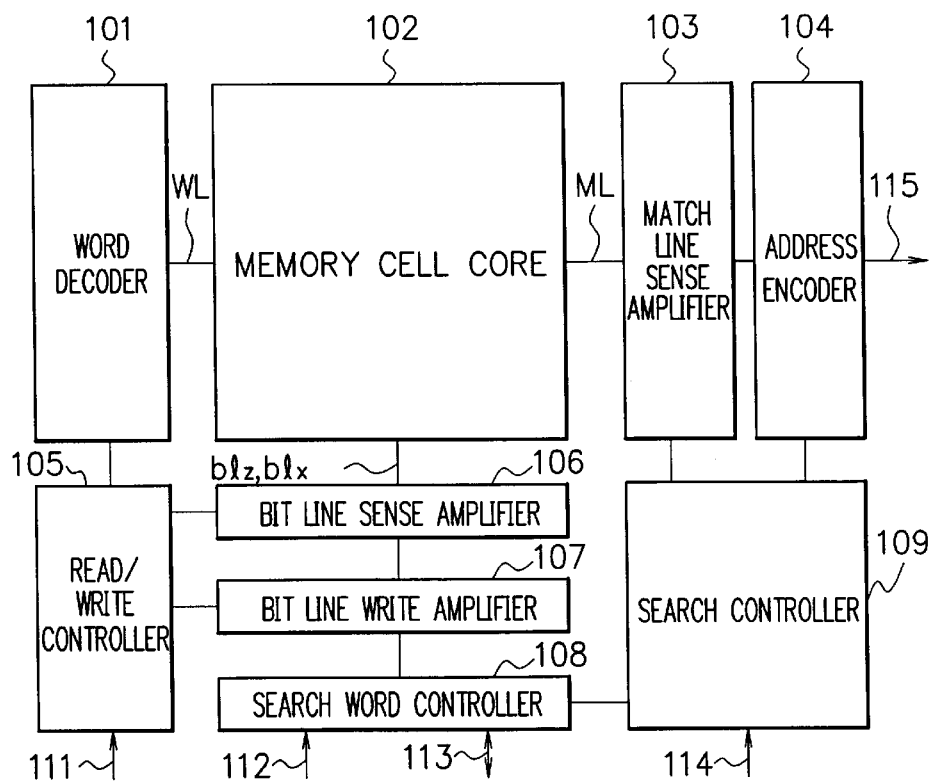
FIG. 1A and FIG. 1B are block diagrams showing a configuration example of a ternary association memory according to a first embodiment of the present invention.
Figure 1B:
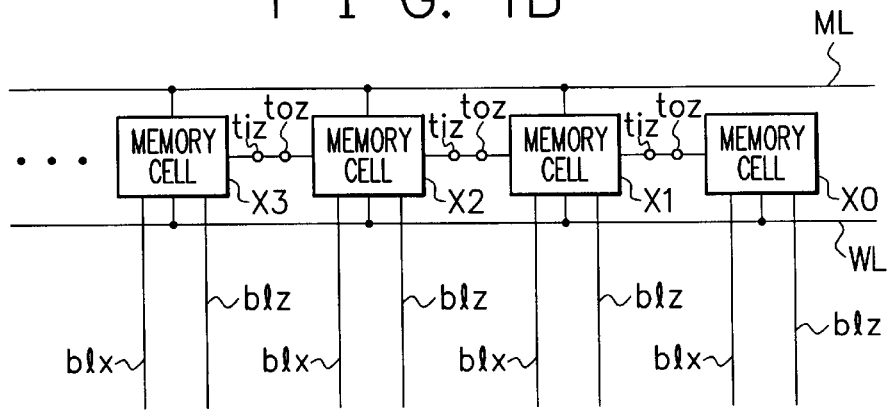

FIG. 1A shows a configuration example of a ternary association memory according to a first embodiment of the present invention. A plurality of memory cells are arranged on the points of intersections of a plurality of word lines WL and a plurality of bit lines blz and blx in a two-dimensional matrix in a memory cell core 102. FIG. 1B shows a plurality of memory cells X0 to X3 connected to one of the word lines WL as a portion of the memory cell core 102. The memory cells X0 to X3 are, for instance, a static random access memory (SRAM).

A read/write controller 105 inputs a command 111 from the outside to control the read and write to the memory cell core 102. When the read/write controller 105 inputs the read command 111, a read address is outputted to a word decoder 101. The word decoder 101 decodes the read address and selects a word line WL. The memory cell core 102 outputs the storage data in the memory cells X0 to X3 corresponding to the selected word line WL to the bit lines blz and blx. The bit lines blz and blx are two-valued data reversing each other. A bit line sense amplifier 106 outputs a read out storage data 113 to the outside according to the bit lines blz and blx.

When the read/write controller 105 inputs the write command 111, a write address is outputted to the word decoder 101. The word decoder 101 decodes the write address and selects a word line WL. The bit line write amplifier 107 outputs a write data 113 inputted from the outside to the bit lines blz and blx. The bit lines blz and blx are two-dimensional data reversing each other. In the memory cell core 102, the write data of the bit lines blz and blx are written in the memory cells X0 to X3 corresponding to the selected word line WL.

A search controller 109 inputs a search command 114 from the outside. In searching, a don't care state can be designated to a portion of the search word. In other words, the memory cell which designates the don't care state is assumed to match, and only the memory cell which does not designate the don't care state is judged whether the search data and the storage data agree with each other or not. A pattern for the don't care state can be selected using the command 114. For instance, a predetermined numbered memory cell from the left end or the right end can be designated as the don't care.

A search word controller 108 designates a search word and a don't care pattern to the bit lines blz and blx according to the don't care pattern by a search word 112 and the command 114. Concretely, the search word controller 108 outputs two-valued search data different from each other to the bit lines blz and blx when not in a don't care state, and outputs "L" to both of the bit lines blz and blx when in a don't care state.

A match line sense amplifier 103 is connected to the memory cell core 102 through the match line ML, and pulls up the match line ML. In the memory cell core 102, a match line ML of the memory cell group in which the search word matches the storage data gets an H level and a match line ML of the memory cell group in which the search word does not match the storage data gets an L level. An address encoder 104 encodes in accordance with the match line ML which is in an H state, and outputs the address 115 in which the search word is stored to the outside.

The ternary association memory designates a don't care pattern by means of the outside command 114 as described above. In addition to this, the ternary association memory allows each memory cell to store whether the memory cell is in a don't care state or not. That is, each memory cell includes three states of 0, 1 and the don't care state. The memory cell to which the don't care is designated is assumed to match without affecting the search result.

As shown in FIG. 1B, the word line WL is connected to the memory cell X0 and the memory cells X1 to X3 which constitute the memory cell group. The bit lines blz and blx are connected to respective memory cells X0 to X3. The match line ML is connected to the memory cells X1 to X3. The memory cells X0 to X3 are connected in series with a transmission line through terminals toz and tiz.

The memory cells X1 to X3 are a memory cell group to store storage words. The memory cell X0 stores a don't care data which indicates whether the memory cell X1 located on the right end in the memory cell group is in the don't care state or not, and outputs the don't care data to the memory cell X1 through the terminals toz and tiz. The memory cell X1 stores the storage data when the memory cell X1 itself is not in the don't care state, and when in the state of don't care, the memory cell X1 stores the don't care data indicating whether the adjacent memory cell X2 is in the state of don't care or not. When both of the don't care data inputting from the memory cell X0 through the input terminal tiz, and the don't care data stored in the memory cell X1 itself indicate the state of don't care, the memory cell X1 outputs the don't care data indicating that the adjacent memory cell X2 is in the state of don't care to the memory cell X2 through the terminals toz and tiz. Except above, the memory cell X1 outputs the don't care data indicating the memory cell X2 is not in the don't care state to the memory cell X2. Both the memory cells X2 and X3 have the same configuration as that of the memory cell X1.

The memory cell group outputs a match data indicating the agreement to the match line ML when the storage data and the search data of all the memory cells X1, X2, X3, and so on in which the search data are supplied through the bit lines blz and blx match with each other.

Figure 2:
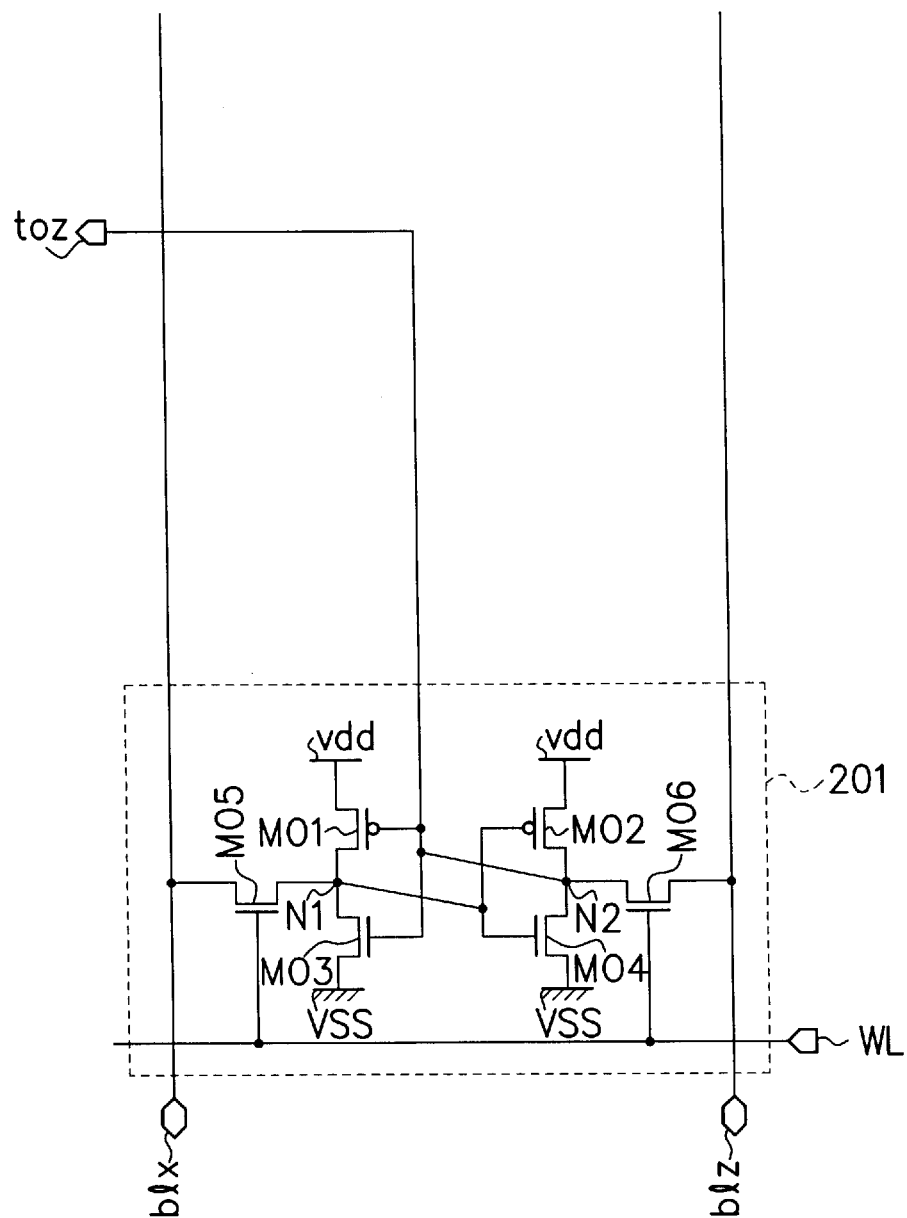
FIG. 2 is a circuit diagram showing a configuration example of an outermost memory cell.

FIG. 2 shows a configuration example of the memory cell X0 in FIG. 1B. The memory cell X0 includes a register 201 which is an SRM. In an n-channel MOS transistor M06, the gate is connected to the word line WL, the drain is connected to the bit line blz, and the source is connected to the node N2. In a p-channel MOS transistor M02, the gate is connected to the node N1, the source is connected to a positive electric potential vdd, and the drain is connected to the node N2. In an n-channel MOS transistor M04, the gate is connected to the node N1, the source is connected to the reference potential (Ground)vss, and the drain is connected to the node N2.

In an n-channel MOS transistor M05, the gate is connected to the word line WL, the drain is connected to the bit line blx, and the source is connected to the node N1. In a p-channel MOS transistor M01, the gate is connected to the node N2, the source is connected to the positive electric potential vdd, and the drain is connected to the node N1. In an n-channel MOS transistor M03, the gate is connected to the node N2, the source is connected to the reference potential (Ground) vss, and the drain is connected to the node N1.

The output terminal toz is connected to the node N2 and outputs the storage data of the node N2 to the adjacent memory cell X1. For the register 201, the data can be performed to read/write through the bit lines blz and blx. For instance, the bit line blz and the node N2 are basic storage data and the bit line blx and the node N1 are the reversed data thereof. That is, the storage content of the register 201 is in the state of the node N2.

When the register 201 stores 0 and (L), which indicates that the adjacent memory cell X1 is in the state of don't care, and when the register 201 stores 1 and (H), which indicates that the adjacent memory cell X1 is not in the state of don't care.

FIG. 3 shows a configuration example of the memory cells X1 to X3 in FIG. 1B. For convenience in the explanation, a configuration of the memory cell X1 will be explained below as an example. The memory cell X1 includes a register 301, a match circuit 302 and a transmission circuit 303. The memory cell in FIG. 14 includes 2 registers, while the memory cell in FIG. 3 includes only one piece of the register 301.

The register 301 has the same configuration as that of the register 201 in FIG. 2. The input terminal tiz inputs the data indicating whether own memory cell is in the don't care state or not. The register 301 of the memory cell X1 stores the don't care data indicating whether the adjacent memory cell X2 is in the state of don't care or not if its own memory cell is in the state of don't care, and stores the storage data if its own memory cell is not in the don't care state.

A configuration of the match circuit 302 will be explained. In an n-channel MOS transistor M15, the gate is connected to the input terminal tiz, and the drain is connected to the match line ML. In an n-channel MOS transistor M12, the gate is connected to the node N1, and the drain is connected to the source of the transistor M15. In an n-channel MOS transistor M14, the gate is connected to the bit line blz, the drain is connected to the source of the transistor M12, and the source is connected to the reference potential vss. In an n-channel MOS transistor M11, the gate is connected to the node N2, and the drain is connected to the source of the transistor M15. In an n-channel MOS transistor M13, the gate is connected to the bit line blx, the drain is connected to the source of the transistor M11, and the source is connected to the reference potential vss. The match line ML is pulled up by the match line sense amplifier 103 (FIG. 1A). When in searching, the word line WL is in L level.

The input terminal tiz is in L level, it indicates that its own memory cell X1 is in the state of don't care. When the input terminal tiz is in L level, the transistor M15 is turned OFF, and the match circuit 302 is cut off from the match line ML. That is, when the memory cell X1 is in the state of don't care, the storage content of the register 301 does not exert an influence on the match line ML. Under this circumstances, the don't care data indicating whether the adjacent memory cell X2 is in the state of don't care or not is stored in the register 301.

On the other hand, if the input terminal tiz is in H level, it indicates that its own memory cell X1 is not in a state of don't care. If own memory cell X1 is not in the state of don't care, the register 301 stores the storage data. If the input terminal tiz is in H level, the transistor M15 is turned ON. The search data is supplied to the bit lines blz and blx from the outside. If the search data and the storage data of the register 301 match with each other, the match line ML takes H level, and if the search data and the storage data of the register 301 do not match with each other, the match line ML takes L level.

Firstly, the explanation will be made for the case when they match with each other. The case when the bit line blz showing the search data is in L level, and the node N2 showing the storage data is in L level will be explained. In this case, the bit line blz and the node N1 are in H level. Since the bit line blz is in L level, the transistor M14 turns OFF, and since the node N2 is in L level, the transistor M11 turns OFF. In other words, the match line ML is cut off from the reference potential vss and maintains H level.

The case when the bit line blz showing the search data is in H level, and the node N2 showing the storage data is in H level will be explained. In this case, the bit line blx and the node N1 are in L level. Since the bit line blx is in L level, the transistor M13 turns OFF, and since the node N1 is in L level, the transistor M12 turns OFF. In other words, the match line ML is cut off from the reference potential vss and maintains H level.

Then, the case of disagreement will be explained. The case when the bit line blz showing the search data is in L level, and the node N2 showing the storage data is in H level will be explained. In this case, the bit line blx is in H level, and the node N1 is in L level. Since the bit line blx is in H level, the transistor M13 turns ON, and since the node N2 is in H level, the transistor M11 turns ON. In other words, the match line ML is connected to the reference potential vss so as to be in L level.

The case when the bit line blz showing the search data is in H level, and the node N2 showing the storage data is in L level will be explained. In this case, the bit line blz is in L level, and the node N1 is in H level. Since the bit line blz is in H level, the transistor M14 turns ON, and since the node N1 is in H level, the transistor M12 turns ON. In other words, the match line ML is connected to the reference potential vss so as to be in L level.

The case when the don't care is designated as the search data will be explained next. In the case of don't care, both bit lines blz and blx are in L level. When the bit lines blz and blx are in L level, the transistors M13 and M14 turn OFF and the match line ML is cut off from the reference potential vss. As a result, the storage content does not exert an influence on the match line ML.

The configuration of the transmission circuit 303 will be explained next. In a p-channel MOS transistor M31, the gate is connected to the input terminal tiz, and the source is connected to a positive potential vdd. In a p-channel MOS transistor M32, the gate is connected to the node N2, and the source is connected to the drain of the transistor M31. In an n-channel MOS transistor M33, the gate is connected to the input terminal tiz, the drain is connected to the drain of the transistor M32, and the source is connected to the reference potential vss. In an n-channel MOS transistor M34, the gate is connected to the node N2, the drain is connected to the drain of the transistor M32, and the source is connected to the reference potential vss. In a p-channel MOS transistor M35, the gate is connected to the drain of the transistor M32, the source is connected to the positive potential vdd, and the drain is connected to the output terminal toz. In an n-channel MOS transistor M36, the gate is connected to the drain of the transistor M32, the drain is connected to the output terminal toz, and the source is connected to the reference potential vss.

The transmission circuit 303 composes an OR (logical add) circuit having two inputs and one output. The two inputs correspond to the input terminal tiz and the node N2, and one output corresponds to the output terminal toz. That is, when both the don't care data inputted from the input terminal tiz and the don't care data stored in the node N2 of its own memory cell register 301 indicate to be in the don't care state (L level), the transmission circuit 303 outputs the don't care data (L) indicating that the adjacent memory cell X2 is in the don't care state to the output terminal toz. Except above, the transmission circuit 303 outputs "H" to the output terminal toz. The output terminal toz indicates the adjacent memory cell X2 being in the state of don't care when the output terminal toz is in L, and indicates the adjacent memory cell X2 being not in the state of don't care when in H level.

Incidentally, the case when an memory cell continued from the right end is designated as the don't care is explained as an example, a memory cell continued from the left end can be designated as the don't care by providing the register X0 on the left end.

Figure 14:
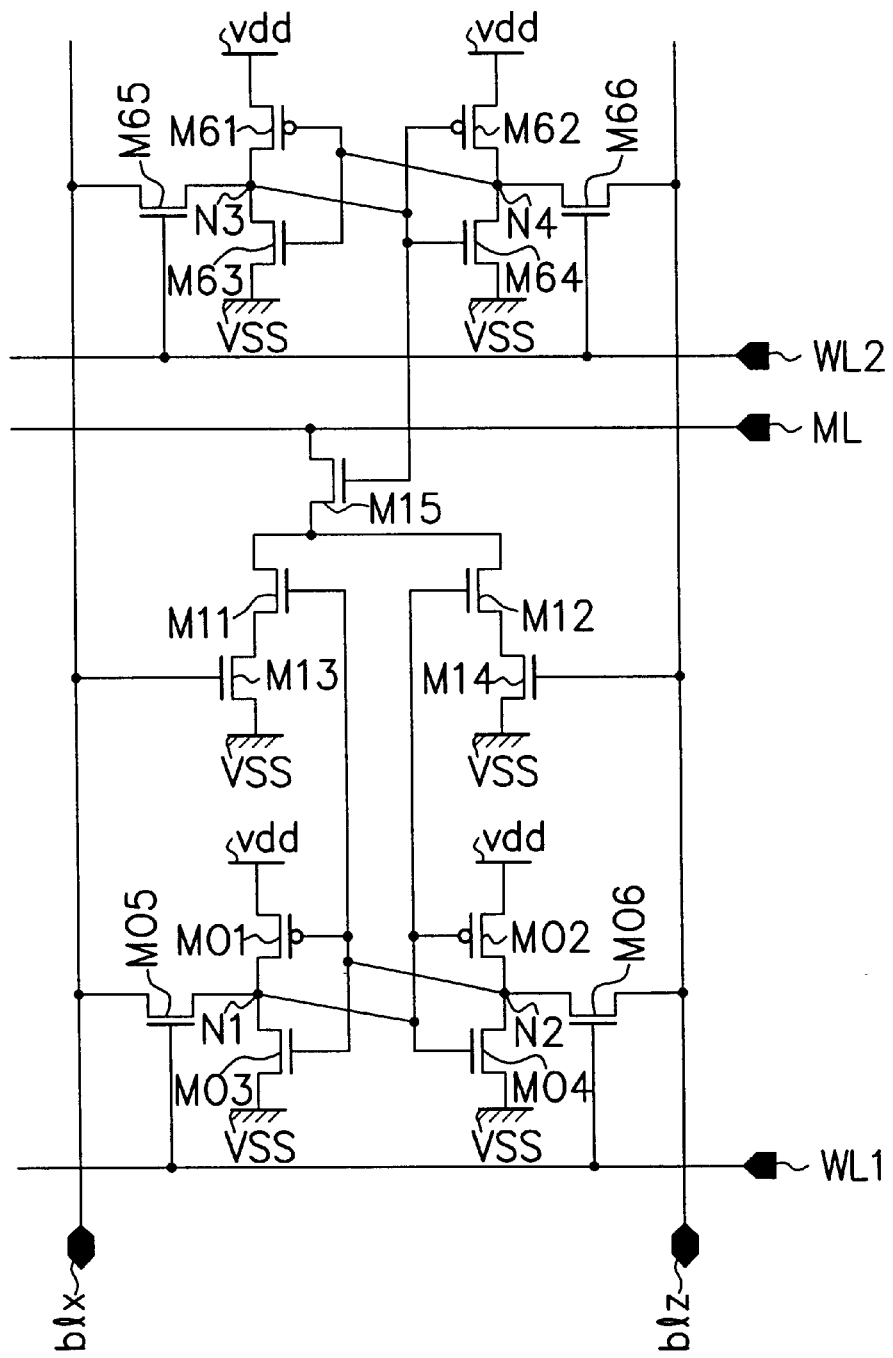
FIG. 14 is a circuit diagram of a memory cell in a conventional ternary association memory.

In FIG. 3, an OR circuit of the transistors M31 to M36 is provided in place of the transistors M61 to M66 in FIG. 14. In the present embodiment, since only one bit register 301 is required to be provided on one piece of memory cell, the total capacity of memory required is only a half of the ternary association memory in FIG. 14, which makes the possibility of failures low and increases the production yield. Furthermore, though two times of the read/write is necessary for two registers in FIG. 14, the read/write to one register 301 can be performed with only one time in FIG. 3.

Figure 4:
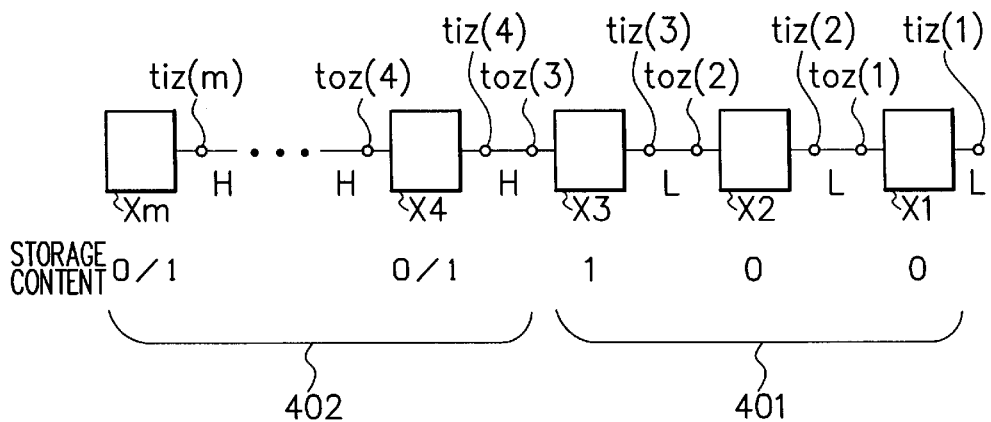
FIG. 4 is a view showing a configuration of the memory cell group and the storage content of each memory cell.

FIG. 4 shows the configuration of the memory cell group and the storage content of each memory cell. An example of an association memory which can designate a memory cell having an optional bit number from the right end as the don't care. The memory cell is defined that the storage content is 0 when the node N1=H and N2=L are given, and that the storage content is 1 when the node N1=L and N2=H are given. The memory cell Xn is in the don't care state when the input terminal tiz(n) equals "L" and at the same time when the storage data is 0, the output terminal toz(n) equals "L". The memory cell Xn stores the storage data when the input terminal tiz(n) equals "H", and the output terminal toz(n) equals "L" irrespective of the storage content. In addition, in the memory cell Xn, when the storage content is 1, the output terminal toz(n) equals "H" irrespective of the input terminal tiz(n).

In FIG. 4, the 3 bits memory cell 401 from the right end indicates a case of the don't care state. In the memory cell X1, the input terminal tiz(1) equals "L" and it is in the don't care state. In the memory cell X1, since the storage content is "0", and the input terminal tiz(1) equals "L", the output terminal toz(1) equals "L", and the bit of the memory cell X2 in the left-hand neighbor is also in the don't care state. This pattern is repeated to the memory cell X3. Though the bit of the memory cell X3 is in the state of don't care, since the storage content of the memory cell X3 is "1", the output terminal toz(3) equals "H". The input terminals tiz(4 to m) and the output terminals toz(4 to m) from the memory cell X4 in the left-hand neighbor to the memory cell Xm in the left end equal "H". The bit of the left end m-3 bit memory cell 402 becomes storage data which is not in the don't care state.

Incidentally, the relationships among the don't care state, the storage content, and the input and output terminals are as above, L/H of the input terminal tiz and the output terminal toz can be in reverse relation.

Second Embodiment

Figure 5:
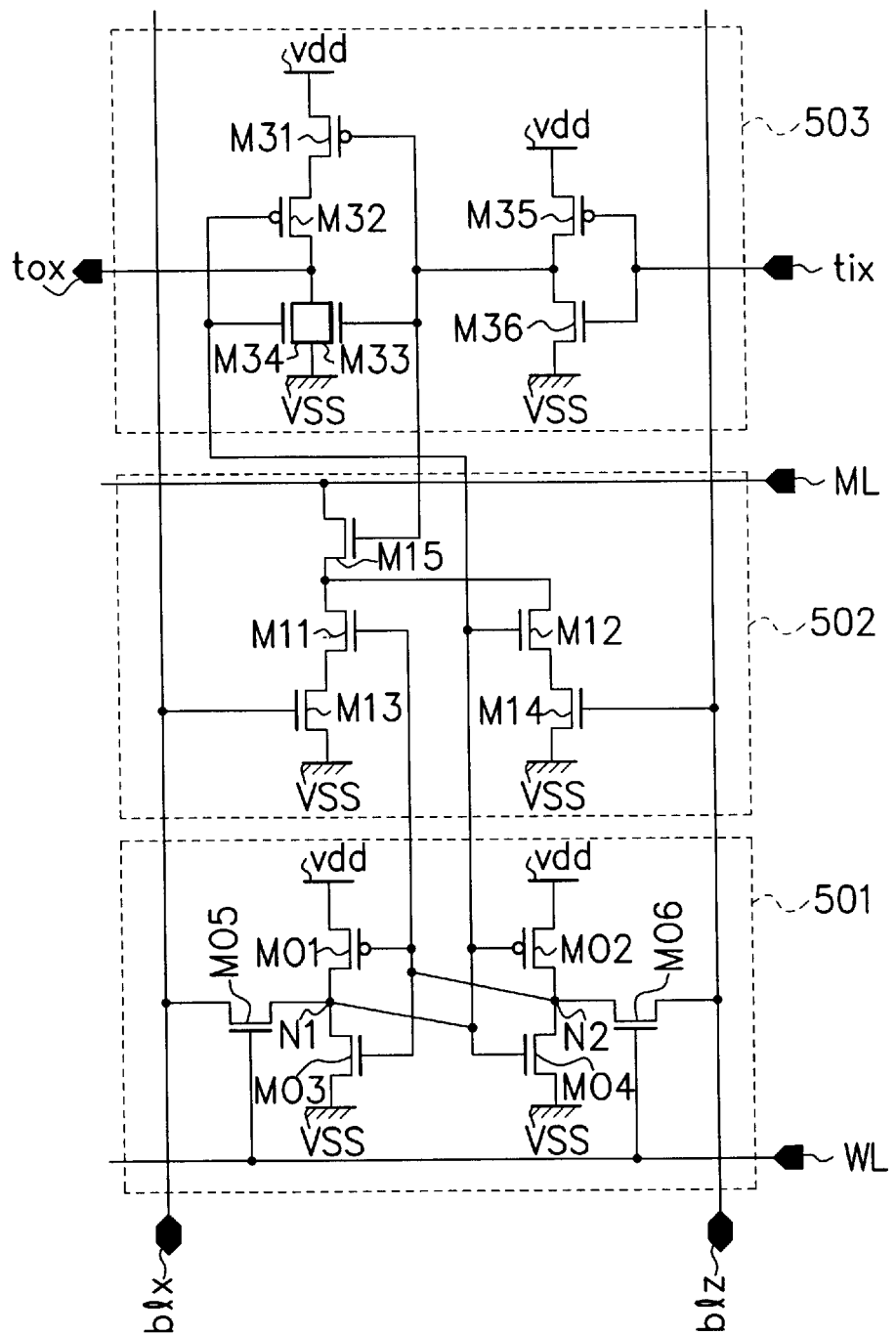
FIG. 5 is a circuit diagram showing a configuration example of a memory cell according to a second embodiment of the present invention.

FIG. 5 shows a configuration example of a memory cell according to a second embodiment of the present invention. Though the first embodiment shows the case that the adjacent memory cell is in the don't care state when the input terminal tiz and the output terminal toz are in the L level, the present embodiment shows a case that the adjacent memory cell is in the don't care state when the input terminal tiz and the output terminal toz are in the H level.

The memory cell includes a register 501, a match circuit 502 and a transmission circuit 503. The register 501 and the match circuit 502 are the same as the register 301 and the match circuit 302 in FIG. 3. A configuration of the transmission circuit 503 will be explained. In a p-channel MOS transistor M35, the gate is connected to the input terminal tix and the source is connected to the positive potential vdd. In an n-channel MOS transistor M36, the gate is connected to the input terminal tix, the drain is connected to the drain of the transistor M35, and the source is connected to the reference potential vss. In a p-channel MOS transistor M31, the gate is connected to the drain of the transistor M35 and the source is connected to the positive potential vdd. In a p-channel MOS transistor M32, the gate is connected to the node N1, the source is connected to the drain of the transistor M31, and the drain is connected to the output terminal tox. In a n-channel MOS transistor M33, the gate is connected to the drain of the transistor M35, the drain is connected to the output terminal tox, and the source is connected to the reference potential vss. In an n-channel MOS transistor M34, the gate is connected to the node N1, the drain is connected to the output terminal tox, and the source is connected to the reference potential vss.

The gate of the transistor M15 of the match circuit 502 is connected to the drain of the transistor M35. The logical inverse level in respect to the level of the input terminal tix is applied to the gate of the transistor M15. That is, the gate of the transistor M15 corresponds to that it is connected to the input terminal tiz in FIG. 3.

Though the output terminal tox of this memory cell is connectable to the input terminal tix of the memory cell in the left-hand neighbor, the explanation here will be made on the assumption that the don't care is in the left side. When the input terminal tix is in the H level, the transistor M15 turns "OFF", and an electric current does not pass from the match line ML irrespective of agreement/disagreement between the storage content and the content of the search data, which makes the match line ML into the H level, so that the storage content and the content of the search data agree with each other. In other words, its own memory cell is in the don't care state. When the input terminal tiz is in the L level, the transistor M15 turns "ON" to output the agreement/disagreement according to the storage content and the search data. When the input terminal tiz is in the H level, and the node N1 is in the L level, the output terminal tox turns in the H level, and the memory cell in the left neighbor comes to the don't care state. When the input terminal tix is in the L level, the output terminal tox is in the L level irrespective of the state of the node N1, so that the memory cell in the left neighbor is not in the don't care state and stores the storage data. When the input terminal tix is in the H level and the node N1 is in the H level, the output terminal tox is in the L level, so that the memory cell in the left-hand neighbor is not in the don't care state and stores the storage data. In the present embodiment, since only one bit register 501 is required to be provided on one piece of memory cell, the total capacity of memory required is only a half of the ternary association memory in FIG. 14, which makes the possibility of failures low and increases the production yield. Furthermore, the read/write to one register 501 can be performed at only one time.

Third Embodiment

Figure 6:
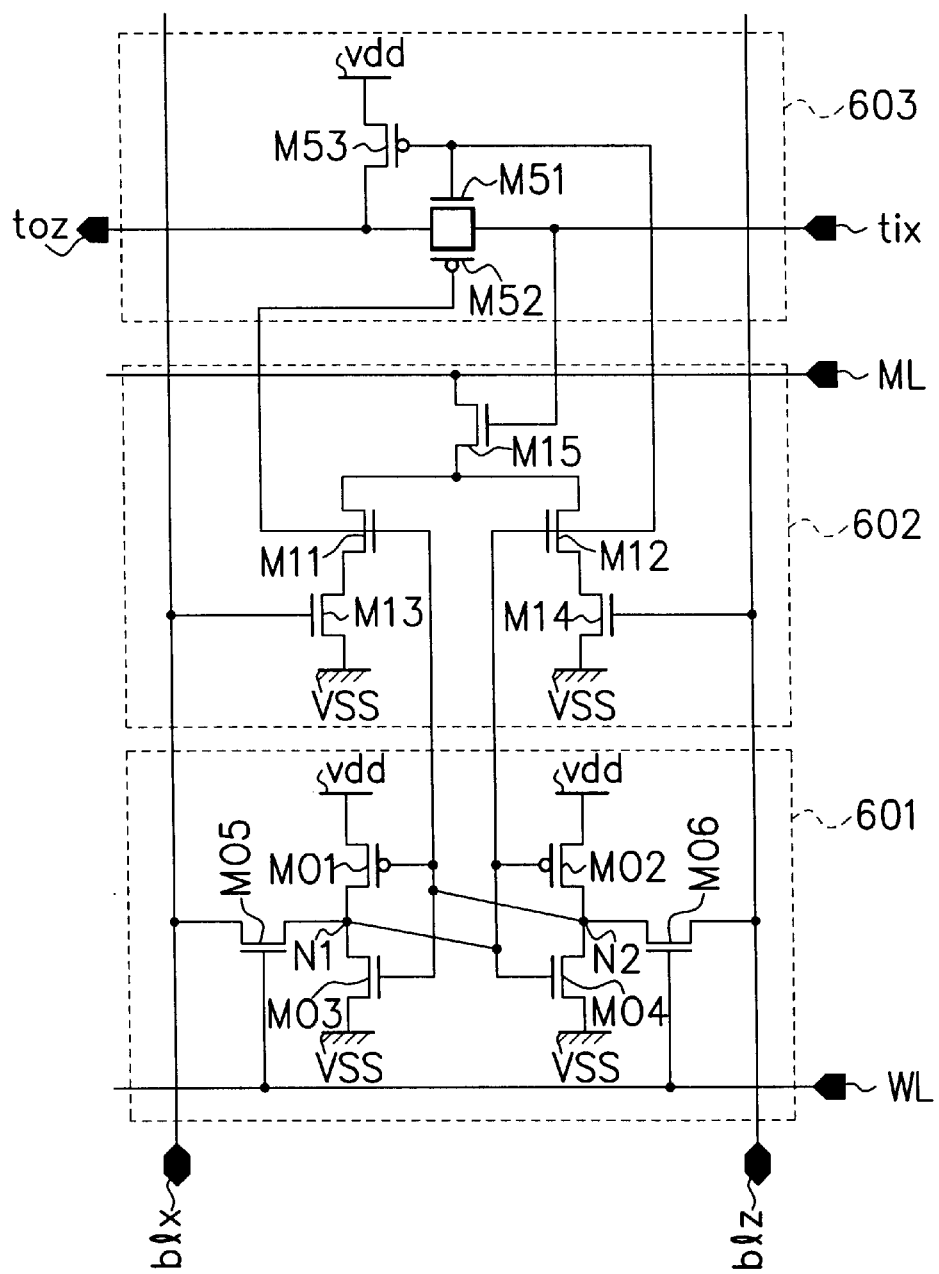
FIG. 6 is a circuit diagram showing a configuration example of a memory cell according to a third embodiment of the present invention.

FIG. 6 shows a configuration example of a memory cell according to a third embodiment of the present invention. The memory cell includes a register 601, a match circuit 602 and a transmission circuit 603. The register 601 and the match circuit 602 are the same as the register 301 and the match circuit 302 in FIG. 3. A configuration of the transmission circuit 603 will be explained. In an n-channel MOS transistor M51, the gate is connected to the node N1, the drain is connected to the input terminal tiz, and the source is connected to the output terminal toz. In p-channel MOS transistor M52, the gate is connected to the node N2, the source is connected to the input terminal tiz, and the drain is connected to the output terminal toz. In a p-channel MOS transistor M53, the gate is connected to the node N1, the source is connected to the positive potential vdd, and the drain is connected to the output terminal toz. The transmission circuit 603 constitute the OR circuit. The operation of the memory cell is the same as that of the memory cell in FIG. 3.

In the present embodiment, the transmission circuit 603 can be composed of three transistors M51 to M53, so that the memory cell can be miniaturized. In addition, since only one bit register is required to be provided on one piece of memory cell, the total capacity of memory required is only a half of the ternary association memory in FIG. 14, which makes the possibility of failures low and increases the production yield.

Fourth Embodiment

Figure 7:
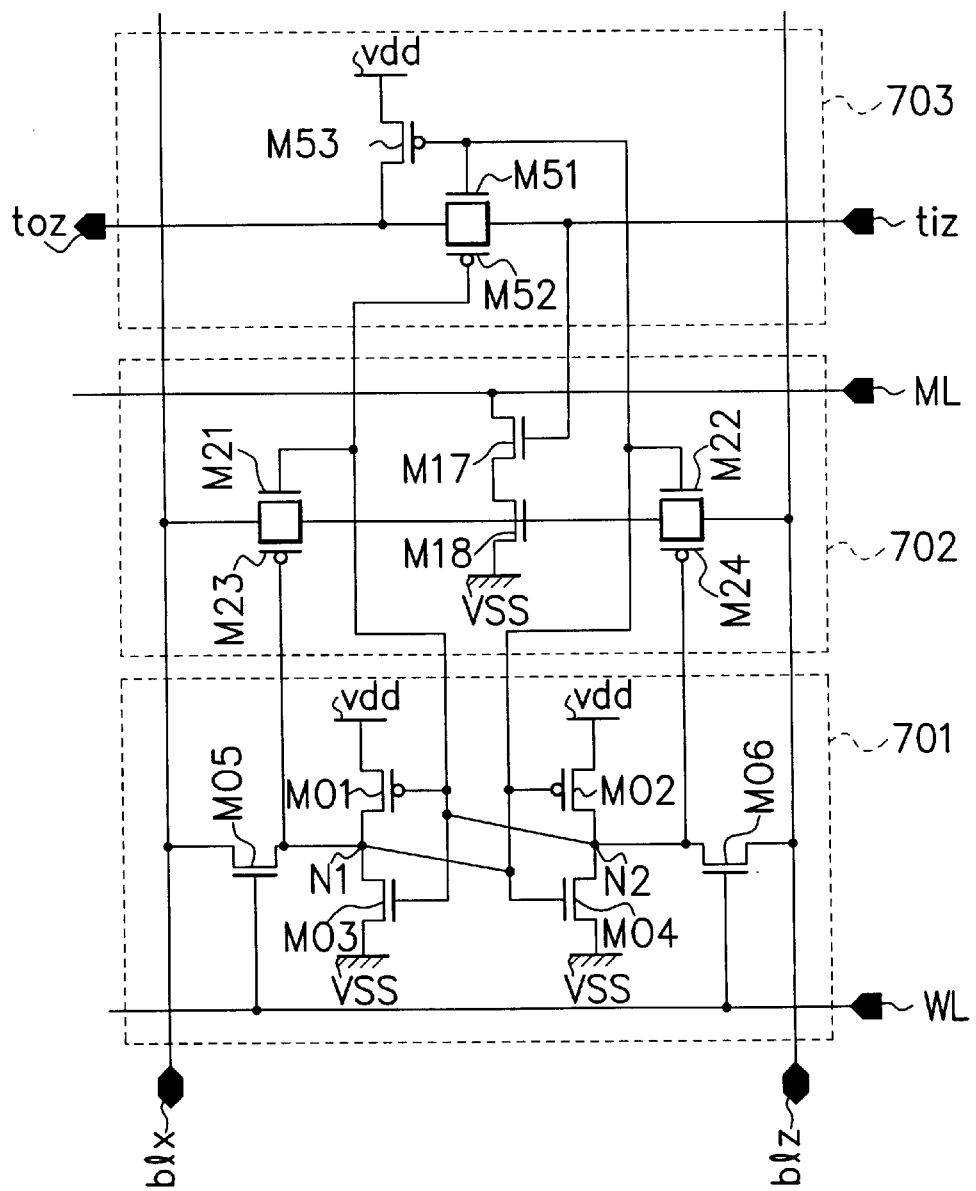
FIG. 7 is a circuit diagram showing a configuration example of a memory cell according to a fourth embodiment of the present invention.

FIG. 7 shows a configuration example of a memory cell according to a fourth embodiment of the present invention. The memory cell includes a register 701, a match circuit 702 and a transmission circuit 703. The register 701 and the transmission circuit 703 are the same as the register 601 and the transmission circuit 603 in FIG. 6. A configuration of the transmission circuit 702 will be explained. In an n-channel MOS transistor M22, the gate is connected to the node N1, and the drain is connected to the bit line blz. In a p-channel MOS transistor M24, the gate is connected to the node N2, the source is connected to the bit line blz, and the drain is connected to the source of the transistor M22. In an n-channel MOS transistor M17, the gate is connected to the input terminal tiz, and the drain is connected to the match line ML. In an n-channel MOS transistor M18, the gate is connected to the source of the transistor M22, the drain is connected to the source of the transistor M17, and the source is connected to the reference potential vss. In an n-channel MOS transistor M21, the gate is connected to the node N2, the drain is connected to the gate of the transistor M18, and the source is connected to the bit line blx. In a p-channel MOS transistor M23, the gate is connected to the node N1, the source is connected to the gate of the transistor M18, and the drain is connected to the bit line blx. The operation of the memory cell is the same as that of the memory cell in FIG. 6.

The memory cell in FIG. 6, 5 pieces of the transistors M11 to M15 to pass an electric current from the match line ML are necessary to be made their channel widths larger than those of other transistors to quicken the operation speed, which results in enlargement of the area. In the memory cell according to the present embodiment, only 2 pieces of the transistors M17 and M18 to pass the current from the match line ML are required to enlarge, the number of the transistors required to be a large area can be reduced so that the total area can be reduced. In addition, since only one bit register is required to be provided on one piece of memory cell, the total capacity of memory required is only a half of the ternary association memory in FIG. 14, which makes the possibility of failures low and increases the production yield.

Fifth Embodiment

Figure 8:
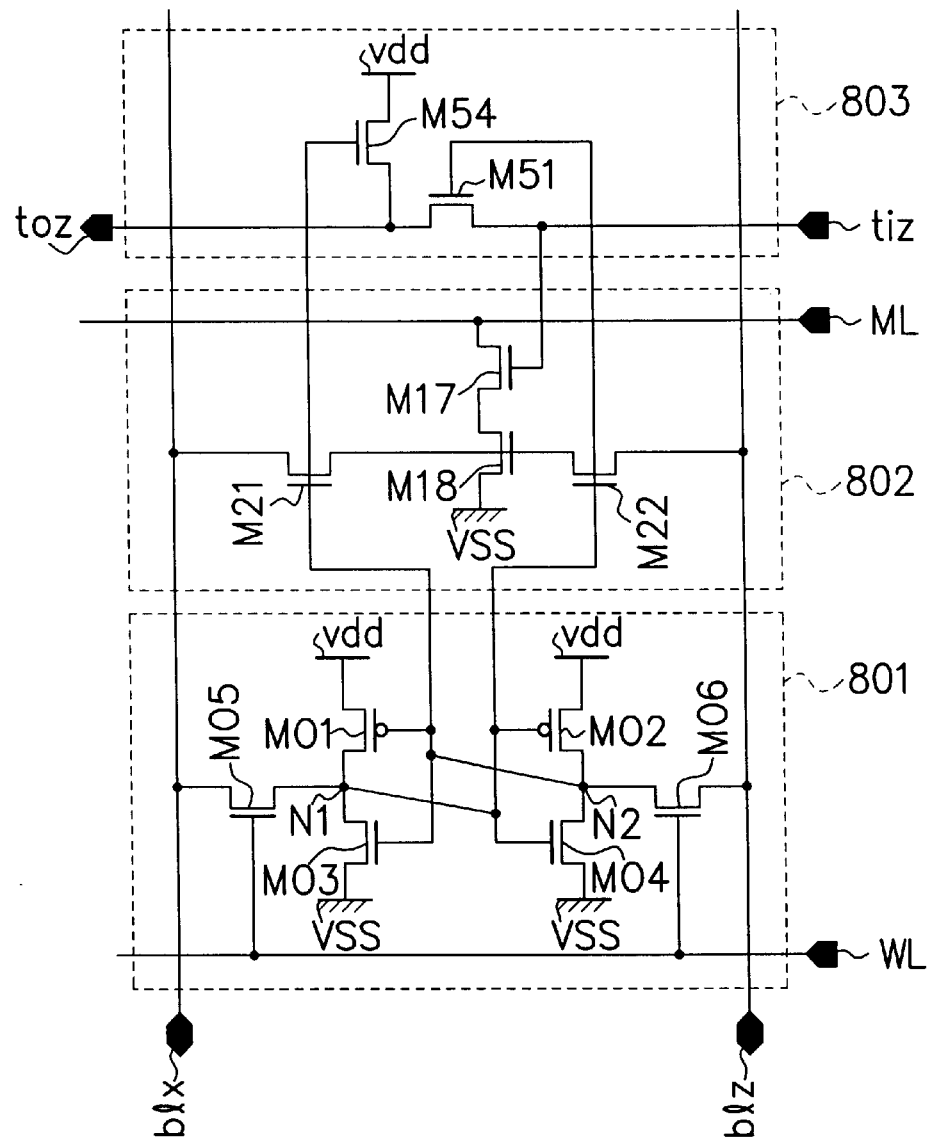
FIG. 8 is a circuit diagram showing a configuration example of a memory cell according to a fifth embodiment of the present invention.

FIG. 8 shows a configuration example according to a fifth embodiment of the present invention. The memory cell includes a registor 801, a match circuit 802 and a transmission circuit 803. The explanation will be made for the points that this memory cell differs from the memory cell in FIG. 7. The transistors M23, M24, and M52 in FIG. 7 are removed and an n-channel MOS transistor M54 is provided in place of a p-channel MOS transistor M53 in FIG. 7. In an n-channel MOS transistor M54, the gate is connected to the node N2, the drain is connected to the positive potential vdd, and the source is connected to the output terminal toz.

According to the present embodiment, the number of the transistors can be reduced and the total area can be reduced, compared to the memory cell in FIG. 7. In addition, the match circuit 802 and the transmission circuit 803 can be composed with only an n-channel MOS transistor. In addition, since only one bit register is required to be provided on one piece of memory cell, the total capacity of memory required is only a half of the ternary association memory in FIG. 14, which makes the possibility of failures low and increases the production yield.

Furthermore, since the gate voltage of the transistor M18 and the input and output terminals tiz and toz, namely the high level voltage of the gate voltage of the transistor M17 becomes lower than the high level voltage vdd of other transistors, an electric current driving the match line ML to the reference potential vss becomes weak, so that the searching speed of the memory cell is decreased. On the contrary, the memory cell in FIG. 7 is capable of improving the search speed.

Sixth Embodiment

Figure 9:
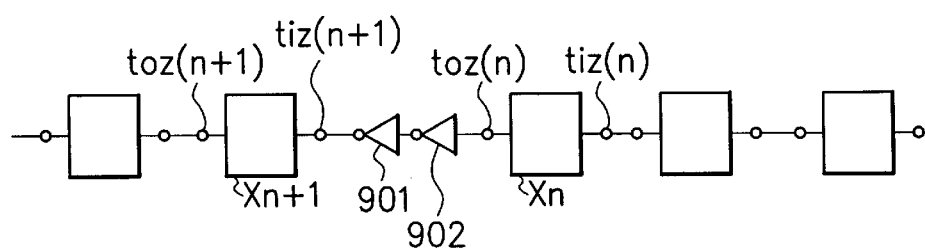
FIG. 9 is a configuration example of the memory cell group according to a sixth example of the present invention.

FIG. 9 shows a configuration example of a memory cell group according to a sixth embodiment of the present invention. In the memory cells in FIG. 6, FIG. 7 and FIG. 8, the transmission circuits 603, 703 and 803 increase in their resistance every time the signal passes through between the terminals tiz and toz, and are apt to become weak against an electric source and noise of the signal. As shown in FIG. 9, by inserting buffers 901 and 902 between the input terminal tiz(n) and the output terminal toz(n+1) at intervals of several pieces of the memory cells, the signal can be amplified and the resistance can be decreased to strengthen against noise. Though the buffers 901 and 902 can be inserted between each cell, it is preferable to insert a piece of the buffer between at least 2 pieces of memory cells Xn and Xn−1.

Seventh Embodiment

Figure 10:
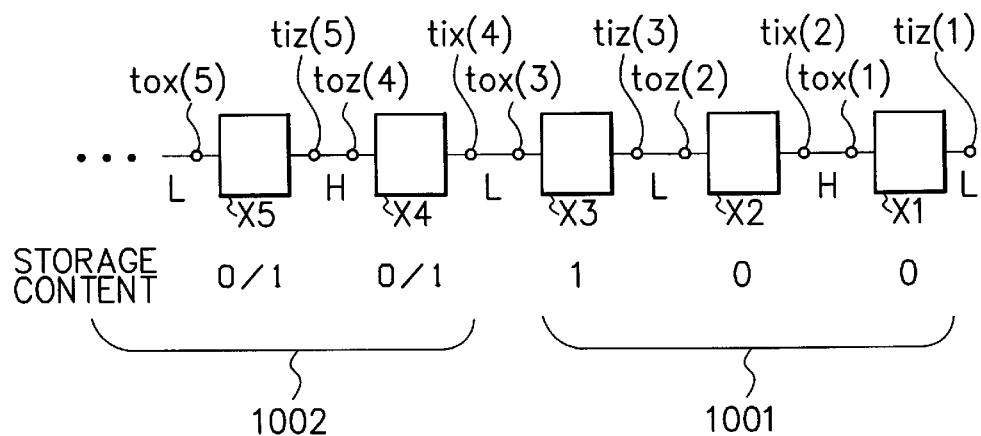
FIG. 10 is a view showing the memory cell group according to a seventh embodiment of the present invention and the storage content of each memory cell.

FIG. 10 shows a configuration example of a memory cell group according to a seventh embodiment of the present invention and the storage content of each memory cell. A memory cell of an optional bit numbers from the right end can be designated as the don't care. The memory cell group uses 2 kinds of memory cells which differ alternatively from each other.

Figure 11:
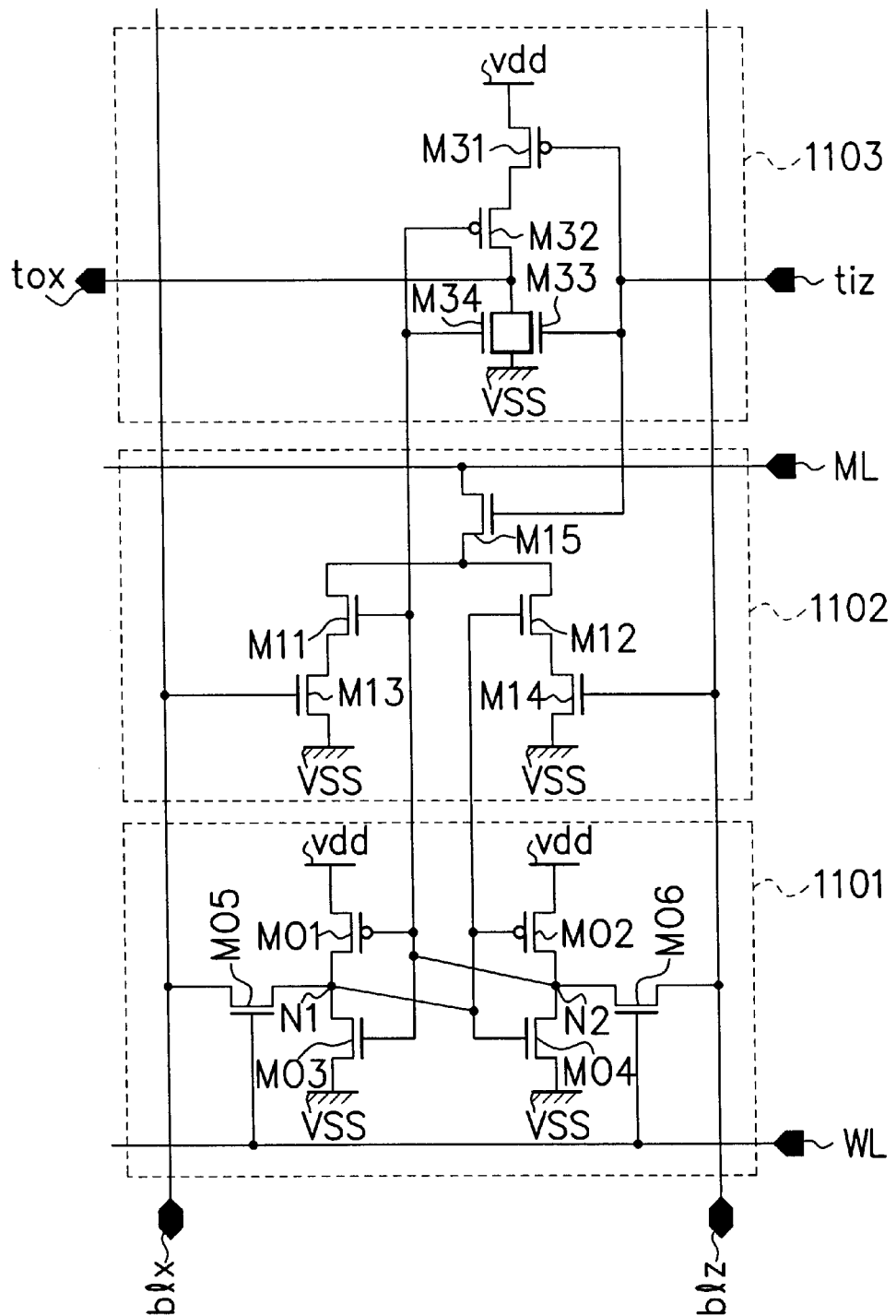
FIG. 11 is a circuit diagram showing a configuration example of an odd-numbered memory cell in the memory cell group in FIG. 10.

In the odd-numbered memory cells X1, X3, X5, and so on, a transmission circuit 1103 is composed of an NOR (negative OR) circuit as shown in FIG. 11. These memory cells X1, X3, X5, and so on indicate that their own are in the don't care states when "L" is inputted into the input terminal tiz. Further, these memory cells X1, X3, X5, and so on store "0" to output "H" from the output terminal tox when the memory cell in the left-hand neighbor is in the don't care state, and store "1" to output "L" from the output terminal tox when the memory cell in the left-hand neighbor is not in the don't care state. The configuration of the memory cell will be explained later referring to FIG. 11.

Figure 12:
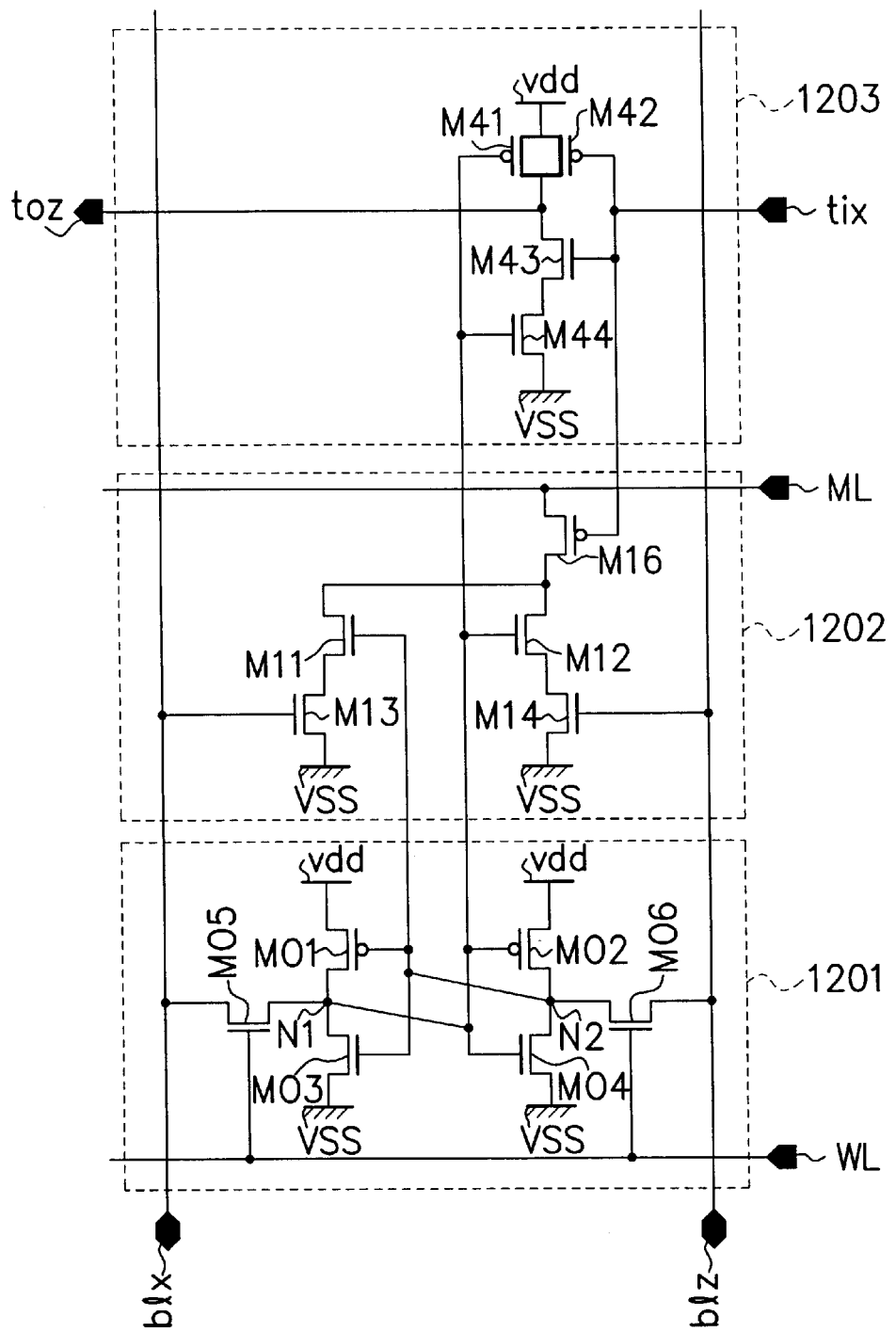
FIG. 12 is a circuit diagram showing a configuration example of an even-numbered memory cell in the memory cell group in FIG. 10.
Figure 13:
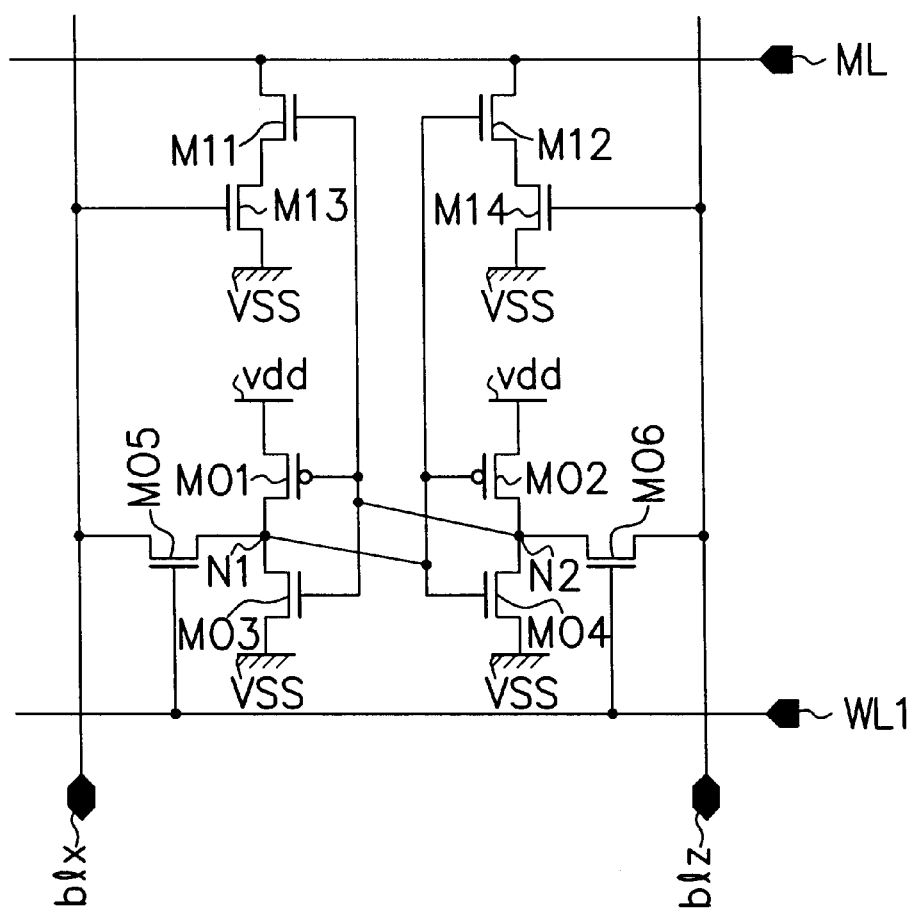
FIG. 13 is a circuit diagram of a memory cell in a conventional binary association memory.

In the even-numbered memory cells X2, X4, X6, and so on, a transmission circuit 1203 is composed of a NAND (nonconjunction) circuit as shown in FIG. 12. Here, 2 inputs of the NAND circuit comprise logical inverse data of the storage data and data of the input terminal tix. These memory cells X2, X4, X6, and so on indicate that their own are in the don't care state when "H" is inputted into the input terminal tix. Further, these memory cells X2, X4, X6, and so on store "0" to output "L" from the output terminal toz when the memory cell in the left-hand neighbor is in the don't care state, and store "1" to output "H" from the output terminal toz when the memory cell in the left-hand neighbor is not in the don't care state. The configuration of the memory cell will be explained later referring to FIG. 12.

The memory cell is defined that the storage content is "0" when the inside node N1=H and N2=L are given, and that the storage content is "1" when the node N1=L and N2=H are given. In FIG. 10, 3 bits of the memory cells 1001 from the right end are in the don't care state, which indicates a case in which other memory cells 1002 are not in the don't care state and store the storage data. In the present embodiment, the logical level L/H of the output terminals tox of the odd-numbered memory cells X1, X3, X5, and so on and the input terminals tix of the even-numbered memory cells X2, X4, X6, and so on is reversed compared to that in FIG. 4.

FIG. 11 shows a configuration example of the odd-numbered memory cells X1, X3, X5, and so on in FIG. 10. This memory cell includes a register 1101, a match circuit 1102, and a transmission circuit 1103. The explanation will be made for the points that this memory cell differs from the memory cell in FIG. 3. In the present embodiment, the transistors M35 and M36 in FIG. 3 are removed and the output terminal tox is connected to the drain of the transistor M32. The transmission circuit 303 in FIG. 3 is an OR circuit, while the transmission circuit 1103 in FIG. 11 is an NOR circuit.

This memory cell connects the input terminal tiz to the output terminal toz of the memory cell in the right-hand neighbor, and connects the output terminal tox to the input terminal tix of the memory cell in the left-hand neighbor. The operation of the memory cell is the same as that of the memory cell in FIG. 3, except that the output terminal tox is in relation of logical inverse to the output terminal toz in FIG. 3. The transmission circuit 1103 in FIG. 11 can be reduced in number of transistors by 2 pieces from the number of transistors of the transmission circuit 303 in FIG. 3 so that the area can be reduced.

FIG. 12 shows a configuration example of the even-numbered memory cells X2, X4, X6, and so on in FIG. 10. The memory cell includes a register 1201, a match circuit 1202, and the transmission circuit 1203. The explanation will be made for the points that this memory cell differs from the memory cell in FIG. 11. In the present embodiment, a p-channel MOS transistor M16 is provided in place of the n-channel MOS transistor M15 in FIG. 11. In the p-channel MOS transistor M16, the gate is connected to the input terminal tix.

The transmission circuit 1203 will be explained next. In a p-channel MOS transistor M42, the gate is connected to the input terminal tix, the source is connected to the positive potential vdd, and the drain is connected to the output terminal toz. In a p-channel MOS transistor M41, the gate is connected to the node N1, the source is connected to the positive potential vdd, and the drain is connected to the output terminal toz. In an n-channel MOS transistor M43, the gate is connected to the input terminal tiz, and the drain is connected to the output terminal toz. In an n-channel MOS transistor M44, the gate is connected to the node N1, the drain is connected to the drain of the transistor M43, and the source is connected to the reference potential vss.

The transmission circuit 1203 composes a NAND circuit. 2 inputs of the NAND circuit comprise the node N1 and the data of the input terminal tix. Here, the node N2 indicates a state of the storage content of the memory cell, and it is in relation of logical inverse to the node N1. In other words, 2 inputs of the NAND circuit are logical inverse data of the storage content of the memory cell and data of the input terminal tix.

This memory cell connects the input terminal tix to the output terminal tox of the memory cell in the right-hand neighbor and connects the output terminal toz to the input terminal tiz of the memory cell in the left-hand neighbor. In the present embodiment, it indicates that the own memory cell is in the don't care state when the input terminal tiz is in the H level. Further, the memory cell stores "0" to output "L" from the output terminal toz when the memory cell in the left-hand neighbor is in the don't care state, and stores "1" to output "H" from the output terminal toz when the memory cell in the left-hand neighbor is not in the don't care state. The transmission circuit 1203 in FIG. 12, can be reduced in number of transistors by 2 pieces from the number of transistors of the transmission circuit 303 in FIG. 3 so that the area can be reduced.

In the present embodiment, the memory cell in FIG. 11 and the memory cell in FIG. 12 are connected alternately as shown in FIG. 10. Since both of the memory cells in FIG. 11 and FIG. 12 are smaller in number of the transistors by 2 pieces compared to that of the memory cell in FIG. 3, the total area can be reduced. In addition, in the present embodiment, the resistance between the input-output signals and the electric source is small compared to the memory cells in FIG. 6 to FIG. 8, which makes the memory cell strong against the noise.

In the ternary association memory, the storage word and the search word different in length of the data from each other are compared in most cases. The don't care designation is used at that time. The portions of the don't care state are mostly put in groups at the right (/left) end part of the storage word or the search word.

The don't care part in the n-bits storage word is limited to any several bits in the right (/left) side of the storage word in the present embodiment. In order to indicate the above-described storage word, the memory includes a two-valued memory cell group in n bits and a memory cell in one bit. Whether one bit of the outermost right (/left) memory cell of the memory cell group in n bits is the don't care or not is determined by the added one bit memory cell other than the n-bits memory cell group. In the memory area of the one bit memory cell stores whether the memory cell in the left (/right)-hand neighbor is the don't care or not. When its own bit is found to be in the don't care state, whether the bit in the left (/right)-hand neighbor is the don't care or not is stored in the one bit storage area of the memory cell. All what required is repeating of the above-described procedure for the adjacent bit.

It is satisfactory to switch the memory cell between the two states of the memory cell to be in the don't care state or not to be in the don't care state according to the signal inputted from the right (/left) adjacent memory cell and transfer the result of performing OR, NAND, NOR or AND (logical multiplication) for the inputted signal and the storage content of the memory cell to the left (/right) adjacent memory cell.

It is also acceptable to use buffer circuits between the output signal and the input signal at intervals of several.memory cells when the memory cells are connected horizontally. Alternately, it is also acceptable to use the memory cell using OR or AND of the gate receipt at intervals of several memory cells.

The effect of the present embodiment will be explained. The don't care part in the storage word in n bits is limited to any several bits in the right (/left) side of the storage word. When one bit of the memory cell X0 in the right (/left) end is "0 (/1), a row of bits from the memory cell X1 in the left (/right) adjacent to the memory cell which stores "1 (/0)" first is defined as the data in the don't care state, and the memory cells from its left (/right) adjacent to the left (/right) end are defined as the storage data not in the don't care state. When the memory cell X0 in the right (/left) end is 1 (/0), the memory cells from its left (/right) adjacent to the left (/right) end are defined as not in the don't care state. Though the association memory using the memory cell in FIG. 14 needs a transfer rate in 2n bits, the number of bits required for the read/write in the association memory of the present embodiment can be reduced to substantially a half of n+1 bits, so that reduction of the read/write time or reduction of number of the bit lines becomes possible.

Furthermore, it is sufficient if each memory cell is provided with a register to store one bit, and the total memory capacity of the semiconductor chip can be reduced. In addition, by using a transmission circuit having a small area, reduction of the memory cell itself can be realized.

Several kinds of methods to compose the transmission circuit with transistors are conceivable. However, there are some circuits which becomes large in resistance between the output signal and the electric source and weak against noise every time the current passes through the circuit. When using such a circuit, by inserting a circuit corresponding to the buffer between the output signal and the input signal at intervals of several memory cells, the resistance between the electric source and the output signal can be reduced and can be strong against the noise. Alternately, the resistance between the electric source and the output signal can be reduced by utilizing the memory cell using gate receipt OR or AND at intervals of several memory cells.

Incidentally, the memory cell X0 may take the same configuration as those in the memory cell X1 to X3 in FIG. 1B. Since symmetric nature of the circuit pattern is improved by making the memory cells X0 to X3 to be the same configuration, designing is simplified, and the movement can be stabilized.

As described above, according to the present embodiments, it becomes possible to realize reduction of the memory cell size of the ternary association memory, improvement of the production yield, reduction of the read/write time to the memory cell, and/or reduction of number of the bit lines.

It should be noted that the present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

As described above, since the register stores either the storage data or the don't care data, 2 pieces of registers to store both the store data and the don't care data are not necessary to be provided with. Since provision of one piece of register is enough for the memory cell, the total storage capacity of the memory becomes small, the possibility of failures can be reduced and the production yield can be increased. Further, the memory cell and the association memory including thereof can be miniaturized. Since only one piece of register is required to be provided on the memory cell, the read/write to the one piece of the register can be performed at only one time. In other words, reduction of the read/write time and reduction of number of the bit lines become possible.

What is claimed is:

1. An association memory, comprising:
   a memory cell group including a plurality of first memory cells to store storage data when own memory cell is not in a don't care state, and store don't care data indicating whether the adjacent memory cell is in the don't care state or not when own memory cell is in the don't care state;
   a word line to be connected to the first memory cells in said memory cell group to select said memory group;
   a plurality of bit lines to be connected to said plurality of the first memory cells respectively to supply search data to said plurality of the first memory cells;
   a match line to be connected to said memory cell group and to output match data indicating whether said storage data and said search data are the same or not;

a second memory cell to be connected to said word line together with said memory cell group, and to store the don't care data indicating whether the first memory cell at the outermost end in said memory cell group is in the don't care state or not;

a first don't care data transmission line to connect said second memory cell and said first memory cell at the outermost end to transmit the don't care data stored in said second memory cell to said first memory cell at the outermost end; and a second don't care data transmission line to connect said plurality of the first memory cells in series to transmit the don't care data among said plurality of the first memory cells, wherein said first memory cell at the outermost end comprises a first transmission circuit to transmit the don't care data indicating the adjacent first memory cell is in the don't care state to the adjacent first memory cell when both of the don't care data transmitted via the first don't care data transmission line and the don't care data stored in its own memory cell indicate the don't care state, and wherein the first memory cells except said first memory cell at the outermost end comprises a second transmission circuit to transmit the don't care data indicating the adjacent first memory cell is in the don't care state to the adjacent first memory cell when both of the don't care data transmitted via said second don't care data transmission line and the don't care data stored in its own memory cell indicate the don't care state.

2. The association memory according to claim 1, wherein said plurality of the first memory cells are capable of storing the don't care data so that the continuous memory cells from the outermost end are in the don't care state.

3. The association memory according to claim 1, wherein said first and second transmission circuits comprises a logical circuit to input the don't care data transmitted via said first and second don't care data transmission lines respectively and the don't care data stored in said first memory cell, and to out put the don't care data to the adjacent first memory cell.

4. The association memory according to claim 1, wherein said memory cell group output match data indicating the agreement when the storage data in all first memory cells which are not in the don't care state agree with the search data.

5. The association memory according to claim 4, wherein each of said first memory cells comprises a switch to connect to said match line when its own is not in the don't care state, and cuts off from said match line when its own is in the don't care state.

6. The association memory according to claim 5, wherein the switch of said each first memory cell connects the reference potential to said match line when said storage data and said search data are not in agreement with each other, and cuts off the reference potential from said match line when said storage data and said search data are in agreement with each other in the case when its own memory cell is not in the don't care state.

7. The association memory according to claim 1, further comprising:

at least one buffer to be connected to said second don't care transmission line.

8. The association memory according to claim 1, wherein said first and second transmission lines comprises transistors in which respective said first and second don't care transmission lines are connected to the gate.

9. The association memory according to claim 1, wherein, in the alignment order of said plurality of the first memory cells, the first and second transmission circuits in the odd-numbered first memory cell or cells are a NAND circuit and the first and second transmission circuits in the even-numbered first memory cell or cells are an NOR circuit, or the first and second transmission circuits in the odd-numbered first memory cell or cells are an NOR circuit and the first and second transmission circuits in the even-numbered first memory cell or cells are a NAND circuit.

10. The association memory according to claim 1, wherein all of the memory cells in said memory cell group judge that their own are not in the don't care state when said second memory cell stores the don't care data indicating that the said first memory cell at the outermost end is not in the don't care state.

11. The association memory according to claim 1, wherein said bit line is capable of supplying the search data or the don't care data to said first memory cell; and wherein said memory cell group outputs the match data indicating the agreement to said match line when the storage data of all first memory cells to which the search data are supplied via said bit line and the search data are in agreement with each other.

12. The association memory according to claim 11, wherein said bit line comprises the first and second bit lines; and wherein said first bit line and second bit line supply the 2-valued data reversing to each other to said first memory cell when supplying the storage data, and supply the same 2-valued data to said first memory cell when supplying the don't care data.

13. The association memory according to claim 1, further comprising: a read/write controller to read and write the data to said first memory cell via said bit line on selecting said word line.

14. The association memory according to claim 13, wherein said read/write controller can read and write to said second memory cell other than said first memory cell.

15. A memory cell, comprising:

a register to store storage data when its own memory cell is not in the don't care state, and store don't care data indicating whether the adjacent memory cell is in the don't care state or not when its own memory cell is in the don't care state;

a transmission circuit to transmit the don't care data indicating the other adjacent memory cell is in the don't care state to the other adjacent memory cell when both the don't care data transmitted from the one adjacent memory cell and the don't care data stored in its own memory cell indicate the don't care state; and a match circuit to output match data indicating agreement when the storage data stored in said register and the search data supplied from the outside agree with each other.

* * * * *